(12) United States Patent
Yang et al.

(10) Patent No.: US 11,054,454 B2
(45) Date of Patent: Jul. 6, 2021

(54) WIRELESS PASSIVE FIELD STRENGTH PROBE

(71) Applicant: Sichuan University, Sichuan (CN)

(72) Inventors: Yang Yang, Sichuan (CN); Kama Huang, Sichuan (CN); Huacheng Zhu, Sichuan (CN); Xing Chen, Sichuan (CN); Changjun Liu, Sichuan (CN)

(73) Assignee: Sichuan University, Sichuan (CN)

( * ) Notice: Subject to any disclaimer, the term of this patent is extended or adjusted under 35 U.S.C. 154(b) by 76 days.

(21) Appl. No.: 16/699,614

(22) Filed: Nov. 30, 2019

(65) Prior Publication Data

US 2020/0103450 A1    Apr. 2, 2020

(30) Foreign Application Priority Data

Jan. 19, 2019  (CN) .......................... 201910050485.8

(51) Int. Cl.
*G01R 29/08*    (2006.01)
(52) U.S. Cl.
CPC ................ *G01R 29/0878* (2013.01)
(58) Field of Classification Search
CPC . G01R 29/0871; G01R 31/3025; G08C 17/02
See application file for complete search history.

(56) References Cited

U.S. PATENT DOCUMENTS

| | | | | |
|---|---|---|---|---|
| 2009/0001969 A1* | 1/2009 | Berkcan | ................ | G01B 7/004 324/207.16 |
| 2012/0287792 A1* | 11/2012 | Nickel | ............... | H04B 17/0085 370/241 |
| 2013/0035103 A1* | 2/2013 | Mujtaba | ............... | H04B 7/0604 455/450 |
| 2015/0031420 A1* | 1/2015 | Higaki | ................ | H04B 1/0458 455/572 |

* cited by examiner

*Primary Examiner* — Alvaro E Fortich

(57) ABSTRACT

A wireless passive field strength probe includes monopole antennas; a detection module; a micro processing device; a wireless transmission module and an antenna module, wherein the wireless transmission module is connected to the micro processing device and the antenna module; a frequency of the antenna module is different from a frequency of the field to be measured, and is not a harmonic of the frequency of the field to be measured; and a power module connected to the detection module or the antenna module. The wireless passive field strength probe of the present invention transmits the vector electric field, the probe serial numbers and the coordinate signals of the probe in real time through the wireless transmission module, and provides the power supply to the communication module through detecting or receiving microwave signals through the antenna, thereby avoiding inaccurate wireless measurement.

20 Claims, 3 Drawing Sheets

WIRELESS PASSIVE FIELD STRENGTH PROBE

CROSS REFERENCE OF RELATED APPLICATION

The present invention claims priority under 35 U.S.C. 119(a-d) to CN 201910050485.8, filed Jan. 19, 2019.

BACKGROUND OF THE PRESENT INVENTION

Field of Invention

The present invention relates to microwave field measurement, and more particularly to a wireless passive field strength probe.

Description of Related Arts

In microwave energy industrial applications, whether uniform heating or not can directly affect the processing performance of the material being heated. The uniformity of heating depends, on the one hand, on the physical and chemical properties of the material's dielectric properties, and on the other hand, on the electric field distribution in the heating chamber.

Conventionally, the uniformity of heating is mostly characterized by the distribution of the temperature field of the heated material. There is still little literature to analyze the uniformity of the heating chamber from the direct detection of the electromagnetic field distribution in the cavity. In order to detect the electric field distribution in a specific cavity, a special field strength probe is needed to detect the relative strength of the electric field. The probes that accurately measure field strength on the market are expensive (6-10 W) and have a small dynamic range (<1000 V/m), which is not suitable for the detection of field strength uniformity in high-power heating chambers.

Chinese patent application CN 201410829902.6 disclosed a fiber-optic field-strength sensor which reduces the size of the sensor probe to improve the detection accuracy. The field strength is measured and transmitted through the optical fiber. Chinese patent application CN 201410829956.2 disclosed an automatic calibration method for field strength distribution characteristics of electromagnetic reverberation chamber, which uses eight field strength probes to obtain the real-time measurement of the field intensity distribution in the electromagnetic reverberation chamber to achieve the calibration of the spatial field distribution characteristics, but the optical fiber will affect the accuracy of the field strength measurement, and will affect the tightness of the field to be tested.

Chinese patent application CN 201010178527.5 disclosed a wide-band signal transmission system based on wireless transmission in a high-potential environment. The sensor and wireless transmission system measure and transmit physical quantities such as voltage, current, electromagnetic field and temperature under high-potential field, and use a battery as energy supply to the wireless transmission system. However, there are problems such as battery exhaustion and influence of the transmission system signal on influence factors of the field signal.

SUMMARY OF THE PRESENT INVENTION

An object of the present invention is to provide a wireless passive field strength probe to solve problems such as the measurement accuracy of the field strength detecting device in the prior art is affected by the communication device and the system structure is complicated.

Accordingly, in order to accomplish the above object, the present invention provides a wireless passive field strength probe placed in a field to be measured comprising:

three monopole antennas respectively arranged in X/Y/Z axis directions for sensing a field strength to be measured;

a detection module for converting an electric field received by the monopole antennas into a voltage;

a micro processing device for signal acquisition and processing;

a wireless transmission module and an antenna module; wherein the wireless transmission module is connected to the micro processing device and the antenna module; a frequency of the antenna module is different from a frequency of the field to be measured, and is not a harmonic of the frequency of the field to be measured; and a power module connected to the detection module or the antenna module.

Preferably, the micro processing device comprises an information acquisition module connected to the detection module for collecting a voltage signal outputted by the detection module, an A/D conversion module for converting the voltage signal into a voltage value, and a voltage field strength corresponding module and a transmitting module which provide a piecewise linear relationship between the voltage value and a three-dimensional electromagnetic field strength, probe serial numbers and coordinate signals;

wherein the information acquisition module is sequentially connected to the A/D conversion module, the voltage field strength corresponding module, and the transmitting module.

Preferably, the wireless transmission module comprises a patch antenna unit for receiving the transmitting module of the micro processing device.

Preferably, the antenna module comprises a transmitting antenna connected to the patch antenna unit, wherein the transmitting antenna is disposed on a container of the field to be measured through a cut-off hole.

Preferably, the power module is respectively connected to a rectifier, the micro processing device, the detection module, and the wireless transmission module.

Preferably, the detection module is a detecting circuit, and a detecting diode and a capacitor of the detecting circuit are respectively connected to a radio frequency microwave signal device and the micro processing device in parallel.

Alternatively, the detection module is an AD8302 detecting chip.

Preferably, the micro processing device is a single chip microcomputer.

The wireless passive field strength probe of the present invention transmits the vector electric field, the probe serial numbers and the coordinate signals of the probe in real time through the wireless transmission module, and provides the power supply to the communication module through detecting or receiving microwave signals through the antenna, thereby avoiding inaccurate wireless measurement of the probe field caused by the field to be tested which is not tightly sealed and the cable.

BRIEF DESCRIPTION OF THE DRAWINGS

In order to more clearly illustrate the embodiments of the present invention or the technical solutions in the prior art, the drawings used in the embodiments or the description of the prior art will be briefly described below. Obviously, the drawings in the following description only refer to a certain embodiment of the present invention, and other drawings can be obtained by those skilled in the art without any inventive labor.

DETAILED DESCRIPTION OF THE PREFERRED EMBODIMENT

The technical solutions in the embodiments of the present invention are clearly and completely described in the following with reference to the accompanying drawings of the embodiments of the present invention. It is obvious that the described embodiments are only a part of the embodiments of the present invention, but not all embodiments. All other embodiments obtained by those skilled in the art based on the embodiments of the present invention without creative efforts are within the scope of the present invention.

Figure 1:
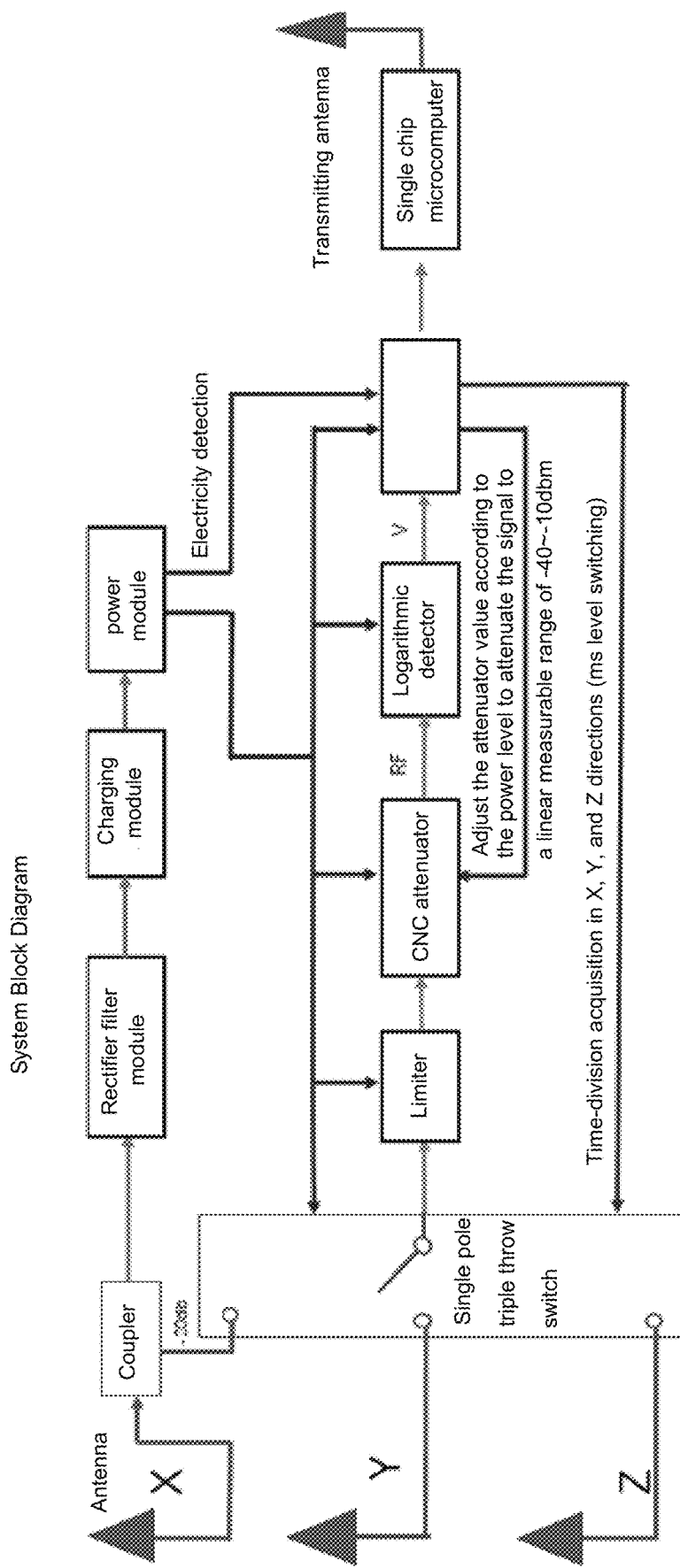
FIG. 1 is a system block diagram of the present invention.
Figure 2:
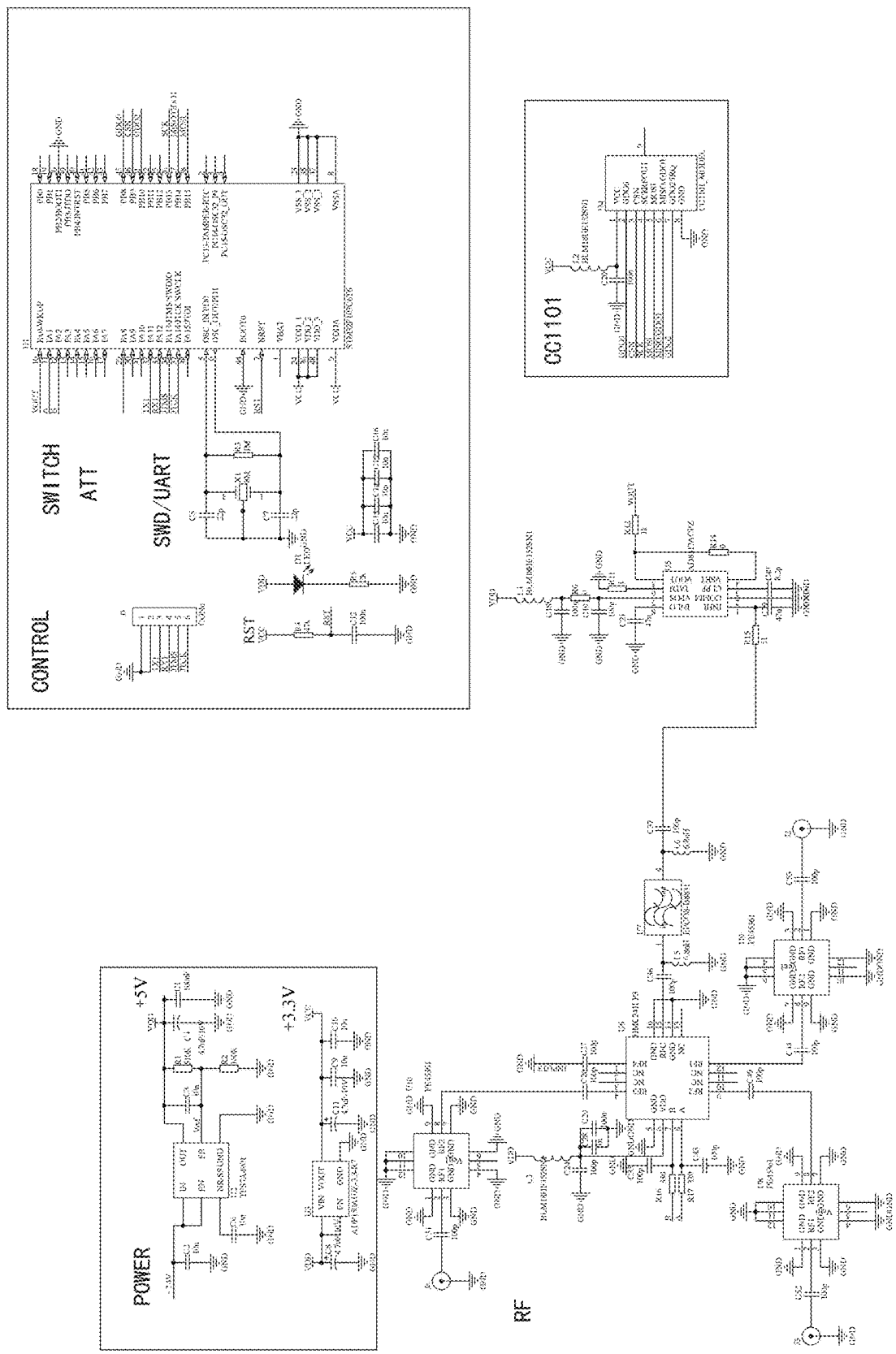
FIG. 2 is a circuit diagram of the present invention.
Figure 3:
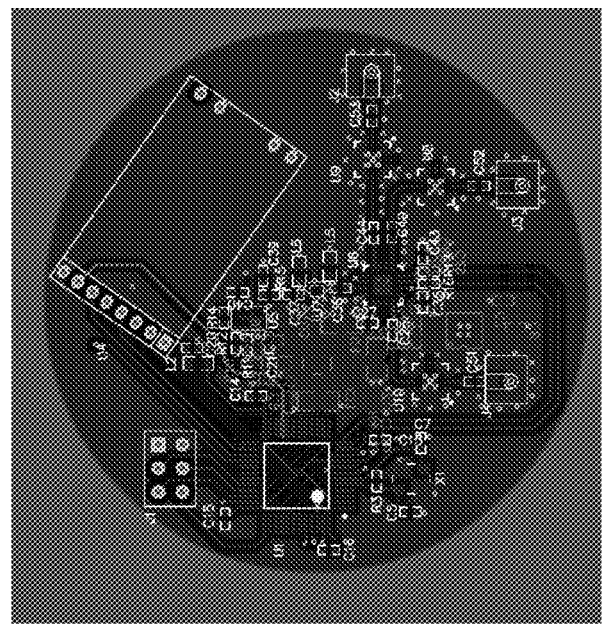
FIG. 3 illustrates an integrated circuit of the present invention.

FIG. 1 is a system block diagram of the present invention; FIG. 2 is a circuit diagram of the present invention; FIG. 3 illustrates an integrated circuit of the present invention. The present invention provides a wireless passive field strength probe placed in a field to be measured comprising: three monopole antennas respectively arranged in X/Y/Z axis directions for sensing a field strength to be measured; a detection module for converting an electric field received by the monopole antennas into a voltage; a micro processing device for signal acquisition and processing, wherein the micro processing device comprises an information acquisition module connected to the detection module for collecting a voltage signal outputted by the detection module, an A/D conversion module for converting the voltage signal into a voltage value, and a voltage field strength corresponding module and a transmitting module which provide a piecewise linear relationship between the voltage value and a three-dimensional electromagnetic field strength, probe serial numbers and coordinate signals; a wireless transmission module and an antenna module; wherein the wireless transmission module is connected to the micro processing device and the antenna module; a frequency of the antenna module is different from a frequency of the field to be measured, and is not a harmonic of the frequency of the field to be measured, wherein the frequency of the wireless transmission signal is a high-frequency electric field higher than the frequency of the electric field to be measured and not in the harmonic frequency band, such as 5.8 GHz and 10 GHz, which ensures the isolation between the field strength to be measured and the transmitting module; an antenna transmitting end of the transmitting module has an isolation protection module, namely a limiter to prevent the power of the field to be measured from being too large to damage the transmitting module; and a power module connected to the detection module or the antenna module.

The information acquisition module is sequentially connected to the A/D conversion module, the voltage field strength corresponding module, and the transmitting module.

Preferably, the wireless transmission module comprises a patch antenna unit for receiving the transmitting module of the micro processing device.

Preferably, the antenna module comprises a transmitting antenna connected to the patch antenna unit, wherein the transmitting antenna is disposed on a container of the field to be measured through a cut-off hole.

Preferably, the power module is respectively connected to a rectifier, the micro processing device, the detection module, and the wireless transmission module.

Preferably, the detection module is a detecting circuit, and a detecting diode and a capacitor of the detecting circuit are respectively connected to a radio frequency microwave signal device and the micro processing device in parallel. Alternatively, the detection module is an AD8302 detecting chip. The micro processing device is a single chip microcomputer.

Embodiment 1: (Provide Energy by Collecting Signals Through a Separate Antenna)

The monopole antennas in the X/Y/Z axis directions receive the electric field signals in each direction at a certain position. The detecting device and the A/D conversion module process the signals. The single chip microcomputer calculates the vector electric field at the position. The wireless transmission module transmits packaged vector electric field, probe serial numbers and the coordinate signals to the router through an external receiving antenna, and the detected electric field distribution is displayed in real time through computer data image processing.

A plurality of probes is set through polyethylene tetrafluoro brackets, so as to obtain the real-time electric field distribution of the field to be measured.

Through a receiving antenna for collecting radio frequency microwave signals, the receiving antenna is connected to the power supply unit through a rectifier, so as to provide energy for the probe wireless transmission module.

Embodiment 2: (Provide Energy by a Detecting Device)

The monopole antennas in the X/Y/Z axis directions receive the electric field signals in each direction at a certain position. The detecting device and the A/D conversion module process the signals. Meanwhile, the detection device is connected to a switch which can be switched between a 2.45 GHz single-pole four-throw switch or a 433 MHz single-pole single-throw switch to provide energy for the wireless transmission module.

The single chip microcomputer calculates the vector electric field at the position. The wireless transmission module wirelessly transmits packaged vector electric field, probe serial numbers and the coordinate signals, so as to obtain the real-time electric field at the position A plurality of probes is set through polyethylene tetrafluoro brackets, so as to obtain the real-time electric field distribution of the field to be measured.

Through a receiving antenna for collecting radio frequency microwave signals, the receiving antenna is connected to the power supply unit through a rectifier, so as to provide energy for the probe wireless transmission module.

Preferably, the antenna module comprises a transmitting antenna connected to the patch antenna unit, wherein the transmitting antenna is disposed on a container of the field to be measured through a cut-off hole.

Preferably, the detection module is a detecting circuit, and a detecting diode and a capacitor of the detecting circuit are respectively connected to a radio frequency microwave signal device and the micro processing device in parallel.

Preferably, the detection module is an AD8302 detecting chip.

The wireless passive field strength probe of the present invention transmits the vector electric field, the probe serial numbers and the coordinate signals of the probe in real time through the wireless transmission module, and provides the power supply to the communication module through detecting or receiving microwave signals through the antenna, thereby avoiding inaccurate wireless measurement of the probe field caused by the field to be tested which is not tightly sealed and the cable.

Of course, those skilled in the art should be able to make various changes and modifications in accordance with the present invention without departing from the spirit and scope of the invention, such changes and modifications are within the scope of protection of the claims.

What is claimed is:

1. A wireless passive field strength probe placed in a field to be measured, comprising:
   three monopole antennas respectively arranged in X/Y/Z axis directions for sensing a field strength to be measured;
   a detection module for converting an electric field received by the monopole antennas into a voltage;
   a micro processing device for signal acquisition and processing;
   a wireless transmission module and an antenna module; wherein the wireless transmission module is connected to the micro processing device and the antenna module; a frequency of the antenna module is different from a frequency of the field to be measured, and is not a harmonic of the frequency of the field to be measured; and
   a power module connected to the detection module or the antenna module.

2. The wireless passive field strength probe, as recited in claim 1, wherein the micro processing device comprises an information acquisition module connected to the detection module for collecting a voltage signal outputted by the detection module, an A/D conversion module for converting the voltage signal into a voltage value, and a voltage field strength corresponding module and a transmitting module which provide a piecewise linear relationship between the voltage value and a three-dimensional electromagnetic field strength, probe serial numbers and coordinate signals;
   wherein the information acquisition module is sequentially connected to the A/D conversion module, the voltage field strength corresponding module, and the transmitting module.

3. The wireless passive field strength probe, as recited in claim 1, wherein the wireless transmission module comprises a patch antenna unit for receiving a transmitting module of the micro processing device.

4. The wireless passive field strength probe, as recited in claim 2, wherein the wireless transmission module comprises a patch antenna unit for receiving the transmitting module of the micro processing device.

5. The wireless passive field strength probe, as recited in claim 3, wherein the antenna module comprises a transmitting antenna connected to the patch antenna unit, wherein the transmitting antenna is disposed on a container of the field to be measured through a cut-off hole.

6. The wireless passive field strength probe, as recited in claim 4, wherein the antenna module comprises a transmitting antenna connected to the patch antenna unit, wherein the transmitting antenna is disposed on a container of the field to be measured through a cut-off hole.

7. The wireless passive field strength probe, as recited in claim 5, wherein the power module is respectively connected to a rectifier, the micro processing device, the detection module, and the wireless transmission module.

8. The wireless passive field strength probe, as recited in claim 6, wherein the power module is respectively connected to a rectifier, the micro processing device, the detection module, and the wireless transmission module.

9. The wireless passive field strength probe, as recited in claim 5, wherein the detection module is a detecting circuit, and a detecting diode and a capacitor of the detecting circuit are respectively connected to a radio frequency microwave signal device and the micro processing device in parallel.

10. The wireless passive field strength probe, as recited in claim 6, wherein the detection module is a detecting circuit, and a detecting diode and a capacitor of the detecting circuit are respectively connected to a radio frequency microwave signal device and the micro processing device in parallel.

11. The wireless passive field strength probe, as recited in claim 7, wherein the detection module is a detecting circuit, and a detecting diode and a capacitor of the detecting circuit are respectively connected to a radio frequency microwave signal device and the micro processing device in parallel.

12. The wireless passive field strength probe, as recited in claim 8, wherein the detection module is a detecting circuit, and a detecting diode and a capacitor of the detecting circuit are respectively connected to a radio frequency microwave signal device and the micro processing device in parallel.

13. The wireless passive field strength probe, as recited in claim 5, wherein the detection module is an AD8302 detecting chip.

14. The wireless passive field strength probe, as recited in claim 6, wherein the detection module is an AD8302 detecting chip.

15. The wireless passive field strength probe, as recited in claim 7, wherein the detection module is an AD8302 detecting chip.

16. The wireless passive field strength probe, as recited in claim 8, wherein the detection module is an AD8302 detecting chip.

17. The wireless passive field strength probe, as recited in claim 13, wherein the micro processing device is a single chip microcomputer.

18. The wireless passive field strength probe, as recited in claim 14, wherein the micro processing device is a single chip microcomputer.

19. The wireless passive field strength probe, as recited in claim 15, wherein the micro processing device is a single chip microcomputer.

20. The wireless passive field strength probe, as recited in claim 16, wherein the micro processing device is a single chip microcomputer.

* * * * *